United States Patent
Otremba et al.

(10) Patent No.: US 10,699,987 B2
(45) Date of Patent: Jun. 30, 2020

(54) SMD PACKAGE WITH FLAT CONTACTS TO PREVENT BOTTLENECK

(71) Applicant: Infineon Technologies Austria AG, Villach (AT)

(72) Inventors: Ralf Otremba, Kaufbeuren (DE); Chooi Mei Chong, Melaka (MY); Markus Dinkel, Unterhaching (DE); Josef Hoeglauer, Heimstetten (DE); Klaus Schiess, Allensbach (DE); Xaver Schloegel, Sachsenkam (DE)

(73) Assignee: tInfineon Technologies Austria AG, Villach (AT)

( * ) Notice: Subject to any disclaimer, the term of this patent is extended or adjusted under 35 U.S.C. 154(b) by 19 days.

(21) Appl. No.: 15/954,233

(22) Filed: Apr. 16, 2018

(65) Prior Publication Data

US 2018/0301398 A1 Oct. 18, 2018

(30) Foreign Application Priority Data

Apr. 18, 2017 (DE) .......................... 10 2017 108 172

(51) Int. Cl.
  *H01L 23/495* (2006.01)
  *H01L 21/48* (2006.01)

(52) U.S. Cl.
  CPC ...... *H01L 23/4951* (2013.01); *H01L 21/4825* (2013.01); *H01L 23/49524* (2013.01); *H01L 23/49562* (2013.01); *H01L 23/49548* (2013.01)

(58) Field of Classification Search
  CPC ............ H01L 23/49861; H01L 23/488; H01L 23/49805; H01L 23/49811; H01L 23/49844; H01L 23/3114; H01L 23/3157; H01L 23/3171; H01L 23/3185; H01L 29/68; H01L 29/7395; H01L 29/7396; H01L 29/7397; H01L 29/7802;
(Continued)

(56) References Cited

U.S. PATENT DOCUMENTS 6,894,376 B1  5/2005 Mostafazadeh et al.
7,365,417 B2  4/2008 Camacho et al.
(Continued)

FOREIGN PATENT DOCUMENTS

DE  102006047761 A1  4/2008
DE  102005057401 B4  10/2009

*Primary Examiner* — Allen L Parker
*Assistant Examiner* — Gustavo G Ramallo
(74) *Attorney, Agent, or Firm* — Murphy, Bilak & Homiller, PLLC (57) ABSTRACT

A package encloses a power semiconductor die that has a first load terminal at a die frontside facing a footprint side of the package and a second load terminal arranged at a die backside facing a top side of the package. The package also includes a lead frame configured to electrically and mechanically couple the package to a support. The lead frame has a planar first outside terminal electrically connected with the first load terminal and a planar second outside terminal electrically connected with the second load terminal. The planar first outside terminal is configured to interface with the support by means of a first contact area. The planar second outside terminal is configured to interface with the support by means of a second contact area. The second contact area has a size in a range between 80% and 120% of a size of the first contact area.

19 Claims, 4 Drawing Sheets

(58) Field of Classification Search
CPC ......... H01L 24/34–41; H01L 23/49541; H01L 23/4951; H01L 23/49562; H01L 23/49548; H01L 29/861; H01L 29/872; H01L 29/8725
See application file for complete search history.

(56) References Cited

U.S. PATENT DOCUMENTS

| | | |
|---|---|---|
| 7,745,929 B2 | 6/2010 | Otremba |
| 7,786,558 B2 | 8/2010 | Otremba |
| 2004/0125577 A1* | 7/2004 | Vinciarelli ........ H01L 23/49827 361/778 |
| 2006/0043613 A1 | 3/2006 | Kobayakawa |
| 2006/0055432 A1* | 3/2006 | Shimokawa .......... H01L 21/565 327/5 |
| 2007/0267729 A1 | 11/2007 | Otremba |
| 2011/0261542 A1* | 10/2011 | Lim .................. H01L 23/49548 361/752 |
| 2012/0168926 A1* | 7/2012 | Cho .................. H01L 23/49524 257/676 |
| 2017/0179011 A1* | 6/2017 | Hashizume ......... H01L 21/4842 |
| 2018/0102307 A1* | 4/2018 | Cho ..................... H02M 7/003 |

* cited by examiner

SMD PACKAGE WITH FLAT CONTACTS TO PREVENT BOTTLENECK

TECHNICAL FIELD

This specification refers to embodiments of a package enclosing a power semiconductor die and to embodiments of a method of producing a package for enclosing a power semiconductor die. In particular, this specification refers to embodiments of a Surface-Mount Device (SMD) package and to corresponding embodiments of a production method.

BACKGROUND

Many functions of modern devices in automotive, consumer and industrial applications, such as converting electrical energy and driving an electric motor or an electric machine, rely on power semiconductor devices.

For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a power semiconductor die configured to conduct a load current along a load current path between two load terminals of the die. Further, the load current path may be controlled by means of an insulated electrode, sometimes referred to as gate electrode. For example, upon receiving a corresponding control signal from, e.g., a driver, the control electrode may set the power semiconductor device in one of a conducting state and a blocking state.

After the power semiconductor die has been manufactured, it has to be included in a package, e.g., in a manner that allows the die to be installed within an application, e.g., in a power converter, e.g., such that the die may be coupled to a support, e.g., a printed circuit board (PCB).

To this end, a technology commonly referred to as surface-mount technology (SMT) is known, wherein this notion may generally refer to producing electronic circuits in which the components are mounted or placed directly onto the surface of PCBs. For example, this technology has replaced, at least in some application areas, the co-called through-hole technology construction method of fitting components with wire leads into holes in the circuit board.

Generally, an SMT component can be smaller than its through-hole counterpart. It may have short pins or leads of various styles, flat contacts (also known as "terminal pads"), a matrix of solder balls (e.g., a so-called Ball Grid Array (BGA)), or terminations on the body of the component.

SUMMARY

Certain aspects of the present specification are related to the surface-mount packaging technology. Exemplary embodiments of the package disclosed herein are surface-mount packages (SMPs). For example, embodiments of the package disclosed herein are surface-mount packages (SMPs) with flat contacts.

According to an embodiment, a package encloses a power semiconductor die. The package has a package top side and a package footprint side, and the die has a first load terminal at a die frontside facing to the package footprint side and a second load terminal arranged at a die backside facing to the package top side. The package comprises: a lead frame configured to electrically and mechanically couple the package to a support, the lead frame having a planar first outside terminal electrically connected with the first load terminal and a planar second outside terminal electrically connected with the second load terminal. The planar first outside terminal is configured to interface with the support by means of a first contact area. The planar second outside terminal is configured to interface with the support by means of a second contact area, the second contact area having a size that is in a range between 80% and 120% of a size of the first contact area. Said range may even be smaller, e.g., 90% to 110% of the size of the first contact area. In an embodiment, the second contact area has a size being within the range of 95% to 105% of the size of the first contact area, e.g., the second contact area may have the same size as the first contact area.

According to another embodiment, a package encloses a power semiconductor die. The package has a package top side and a package footprint side, and the die has a first load terminal at a die frontside facing to the package footprint side and a second load terminal arranged at a die backside facing to the package top side. The package comprises: a lead frame configured to electrically and mechanically couple the package to a support, the lead frame having a planar first outside terminal electrically connected with the first load terminal and a planar second outside terminal electrically connected with the second load terminal. The planar first outside terminal is configured to interface with the support by means of a first contact area. The planar second outside terminal is configured to interface with the support by means of a second contact area. The first outside terminal has a first current rating, and the second outside terminal has a second current rating, the second current rating being in a range between 80% and 120% of the first current rating. Said range may even be smaller, e.g., 90% to 110% of the first current rating. In an embodiment, the second current rating is within the range of 95% to 105% of the first current rating, e.g., the second current rating may be substantially identical to the first current rating.

According to a further embodiment, a method of producing a package for enclosing a power semiconductor die is presented. The package has a package top side and a package footprint side, and the die has a first load terminal at a die frontside facing to the package footprint side and a second load terminal arranged at a die backside facing to the package top side. The method comprises: providing a lead frame configured to electrically and mechanically couple the package to a support, the lead frame having a planar first outside terminal electrically connected with the first load terminal and a planar second outside terminal electrically connected with the second load terminal, wherein the planar first outside terminal is configured to interface with the support by means of a first contact area, and the planar second outside terminal is configured to interface with the support by means of a second contact area; and at least one of a) configuring the second contact area to have a size being in a range between 80% and 120% of a size of the first contact area and b) configuring the first outside terminal 211 to have a first current rating and the second outside terminal 212 with a second current rating, the second current rating being within the range of 80% to 120% of the first current rating.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis being placed upon illustrating principles of the invention. Moreover, in the figures, like reference numerals may designate corresponding parts. In the drawings.

DETAILED DESCRIPTION

In the following detailed description, reference is made to the accompanying drawings which form a part hereof and in which are shown by way of illustration specific embodiments in which the invention may be practiced.

In this regard, directional terminology, such as "top", "bottom", "front", "behind", "back", "leading", "trailing", "below", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the (first) lateral direction X and the (second) lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of the device described herein. Further, in the context of the present specification, the term "in contact" intends to describe that there is a direct physical connection between two elements of the respective semiconductor device; e.g., a transition between two elements being in contact with each other may not include a further intermediate element or the like; i.e., said two elements may be in touch with each other.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor die, e.g., a power semiconductor die that may be used within a power converter or a power supply. Thus, in an embodiment, such die can be configured to carry a load current that is to be fed to a load and/or, respectively, that is provided by a power source. For example, the die may comprise one or more active power semiconductor cells, such as a monolithically integrated diode cell, and/or a monolithically integrated transistor cell, and/or a monolithically integrated IGBT cell, and/or a monolithically integrated RC-IGBT cell, and/or a monolithically integrated MOS Gated Diode (MGD) cell, and/or a monolithically integrated MOSFET cell and/or derivatives thereof. A plurality of such diode cells and/or such transistor cells may be integrated in the die.

The term "power semiconductor die" as used in this specification intends to describe a single die with high voltage blocking and/or high current-carrying capabilities. In other words, such power semiconductor die is intended for high current, typically in the Ampere range, e.g., up to 5 or 100 Amperes, and/or voltages typically above 15 V, more typically up to 40 V, and above, e.g., up to at least 500 V or more than 500 V, e.g. at least 600 V.

For example, the power semiconductor die described below may be a die that is configured to be employed as a power component in a low-, medium- and/or high voltage application. For example, the term "power semiconductor die" as used in this specification is not directed to logic semiconductor devices that are used for, e.g., storing data, computing data and/or other types of semiconductor based data processing.

Before being able to be employed within an application, the power semiconductor die is usually included within a package that may allow mechanically mounting and electrically connecting the die within the application, e.g., also for heat distribution purposes. As has been introductorily mentioned, this may include apply the surface-mount technology (SMT).

Exemplary embodiments of the package disclosed herein are surface-mount packages (SMPs). For example, embodiments of the package disclosed herein are surface-mount packages (SMPs) with flat contacts that interface with a support, e.g., a PCB. A general idea of some embodiments is to dimension the flat contacts used for load current carrying purposes in a similar manner in terms of contact areas and/or in terms of current ratings. For example, this may allow for operating a die enclosed in the package in upper operating ranges while simultaneously ensuring that the heat dissipation caused at the flat contacts does remain within the admissible ranges. Thereby, it may be ensured that the enclosed power semiconductor die can be operated within its entire power rating range without having one of the flat contacts forming a bottleneck. Further, the heat dissipation caused at the flat contacts may be symmetrically balanced.

Figure 1:
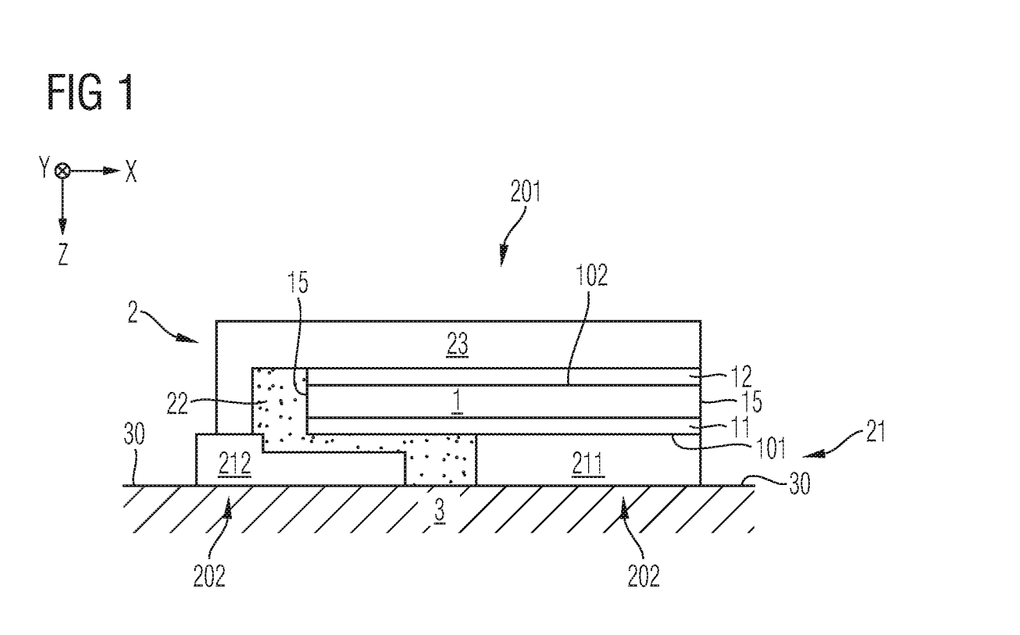
FIG. 1 schematically and exemplarily illustrates a section of a vertical cross-section of a package in accordance with one or more embodiments.
Figure 2:
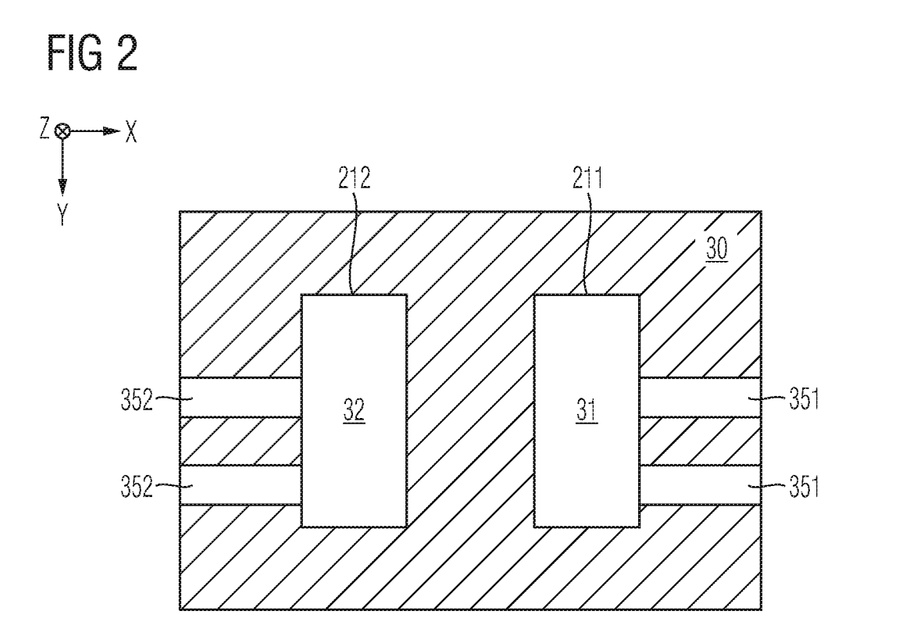
FIG. 2 schematically and exemplarily illustrates a section of a horizontal cross-section of a package in accordance with one or more embodiments.

FIG. 1 schematically and exemplarily illustrates a section of a vertical cross-section of a package 1 in accordance with one or more embodiments and FIG. 2 schematically and exemplarily illustrates a section of a horizontal cross-section of a package in accordance with one or more embodiments. In the following, it will be referred to each of FIG. 1 and FIG. 2.

The package 2 encloses a power semiconductor die 1, the following also referred to as die 1. For example, the die 1 has one of the power semiconductor transistor configuration or a power semiconductor diode configuration, e.g., a MOSFET configuration, an IGBT configuration, or a configuration derived from these basic configurations.

The power semiconductor die 1 may comprise a first load terminal 11 and the second load terminal 12 may be configured to conduct a load current between these load terminals 11 and 12. The load current maybe within the range of 1 A to 300 A, for example within the range of 10 A to 50 A. The maximum load current that can continuously be conducted by the die 1 can be indicated by a load current rating of the die 1.

Further, the enclosed die 1 may be configured to block a voltage between the first load terminal 11 and the second load 12, e.g., within the range of 10 V to 500 V, e.g., within the range of 50 V to 300 V. The maximum voltage that can continuously be blocked by the die 1 can be indicated by a blocking voltage rating of the die 1.

In an embodiment, the die 1 can be one of power diode, in which case the first load terminal 11 can be anode port and the second load terminal 12 can be cathode port, a power IGBT, in which case the first load terminal 11 can be an emitter terminal and the second load terminal 12 can be collector terminal, a MOSFET, in which case the first load terminal 11 can be a source terminal and the second load terminal 12 can be drain terminal, or a power device derived from one or more of these basic configurations, e.g., a JFET (Junction Field Effect Transistor), sometimes referred to as SFET (German: Sperrschicht Feld Effekt Transistor).

For example, the second load terminal 12 arranged at the die backside 102 can be formed by means of a backside metallization. In an embodiment, the die 1 includes only the second load terminal 12 at the die backside 102 and no other terminal are arranged on the die backside 102. Further, on the die frontside 101 where the first load terminal 11 is arranged, there may additionally be arranged at least one further terminal, e.g., at least one of a sensor terminal and a control terminal, e.g., a gate terminal in case the die 1 is implemented controllable device, such as an MGD or a transistor, e.g., MOSFET or an IGBT. For example, the further terminal (e.g. the control terminal and/or the sensor terminal) may be electrically insulated from each of the first load terminal 11 and the second load terminal 12.

In an embodiment, the die 1 that is enclosed by the package 2 has a vertical configuration, according to which the first load terminal 11 is arranged at a die frontside 101 and the second load terminal 12 is arranged at a die backside 102. In lateral directions, e.g., in the lateral directions X and Y and linear combinations thereof, the die 1 may be terminated by a die edge 15, e.g., a side surface.

The package 2 that encloses the die 1 has a package top side 201 and a package footprint side 202. For example, the die 1 is sandwiched in between the package top side 201 and the package footprint side 202. The package 2 may entirely surround the die 1 and seal the die 1 against the environment. To this end, the package 2 may comprise common materials and components, such as a housing (cf. reference numeral 24 in FIG. 4 and in FIG. 6), insulating material, molding mass etc.

In an embodiment, the package top side 201 can be used for dissipating heat produced during operation of the power semiconductor die 1 (power losses), wherein, at the package footprint side 202, outside terminals 212 and 211 may be provided that allow for electrical connection with the terminals 11, 12 of the power semiconductor die 1. For example, all outside terminals may be provided at the package footprint side 202 and none at the package top side 201.

The package 2 enclosing the die 1 may be mounted on a support 3, e.g., in accordance with the surface-mount technology. For example, the package 2 may be a surface-mount package (SMT). Further, when being mounted on the support 3, the die 1 included in the package 2 may be electrically connected with other components (not illustrated) that are provided (e.g. fixed) at the support 3.

The support 3 may be a printed circuit-board (PCB) or may be a component of a PCB. In another embodiment, the support 3 may be a Direct Copper Bond (DCB) substrate, e.g. a ceramic circuit board, or may be a component of a DCB substrate. In another embodiment, the support 3 may be an Insulated Metallic Substrate (IMS) or may be a component of an IMS. The support 3 may be made of an electrically insulating material, e.g., made of a polymer, a PCB laminate, a ceramic, a flame retardant (FR) material (e.g., FR4), a composite epoxy material (CEM), such as CEM1 or CEM3, a Bismaleimide-Triazine resin (BT) material, imide, polyimide, ABF, or made of a combination of the aforementioned exemplary materials.

The die 1 may be arranged in the package 2 in such a manner that the die frontside 101 faces to the package footprint side 202 and that the die backside 102 faces to the package top side 201, as illustrated in FIG. 1. Further, the package footprint side 202 may face to a surface 30 of the support 3. For example, the surface 30 is arranged horizontally, e.g., in parallel to the plane defined by the first lateral direction X and the second lateral direction Y.

For example, the die 1 enclosed by the package is a vertical MOSFET and the first load terminal 11 is a source terminal and the second load terminal 12 is a drain terminal comprising, e.g., a die backside metallization. Further, the die 1 may be arranged within the package in a "source-down" manner, which means that the source terminal 11 faces to the package footprint side 202.

For example, the package 2 may comprise a lead frame 21 configured to electrically and mechanically couple the package 2 to the support 3. The lead frame 21 may for example be configured to couple the package 2 to the support 3, for example such that the package footprint side 202 faces to the surface 30 of the support 3, as illustrated in FIG. 1. The lead frame 21 may serve as a conductive interface between the load terminals 11, 12 (and, if present, the one or more further terminals of the die 1) and other components (not illustrated) that are fixed at the support 3. For example, the support 3 may comprise or be provided with other components (not illustrated; for example, one or more other packages including one or more other dies, and/or a controller, a sensor, a passive component, a load or the like) to which the terminals 11, 12 of the die 1 are to be coupled via the lead frame 21. A connection between the lead frame 21 and the terminals of the die 1, e.g., the load terminals 11 and 12, may be realized by package internal connection means. For connecting the die 1 with other components fixed to the support, the lead frame 21 may comprise two or more planar outside terminals, as will now be explained in more detail:

In an embodiment, the lead frame 21 has a planar first outside terminal 211 electrically connected with the first load terminal 11 and a planar second outside terminal 212 electrically connected with the second load terminal 12. For example, within the present specification, the term "planar" may express that the first terminal 211 and the second terminal 212 may exhibit a respective substantially plane bottom surface that has size with horizontal dimensions (e.g. along each of the first lateral direction X and the second lateral direction Y) at least as great as a vertical dimension of the respective terminal 211, 212 (e.g. along the vertical direction Z), as exemplarily illustrated in FIG. 1. For example, the lead frame 21 has a surface-mount configuration. To this end, the planar outside terminals 211 and 212 may be configured to allow mounting the package 2 in accordance with the surface-mount technology. Further, each of the first outside terminal 211 and the second outside terminal 212 may be so-called flat contacts (also known as "terminal pads") formed in accordance with the surface-mount technology. For example, the outside terminals 211 and 212 are not configured as contact pins or as contact balls.

The first planar outside terminal 211 may be arranged in direct contact with the first load terminal 11, e.g. a source terminal, of the die 1. For electrically connecting the second planar outside terminal 212 with the second load terminal 12, which is arranged at the die backside 102, a package internal connection may be provided. For example, a clip 23 can be disposed over the die backside 102 and the clip 23 may extend over and spaced from the edge 15 of the die 1 to the second outside terminal 212, e.g., down to the second outside terminal 212, as illustrated in FIG. 1. For example, an embodiment of the clip 23 presented herein may be configured as a clip described in US 2007/0090523 A1. The clip 23 may for example lie on the second load terminal 12 and may dock on the planar second outside terminal 212, e.g., in a region that does not laterally overlap with the die 1. The two planar outside terminals 211 and 212 may be arranged separately and electrically insulated from each other. In an embodiment, the space confined by the two planar outside the terminals 211 and 212 and the die 1 may be filled with an insulating material 22, e.g., a molding mass.

Referring now additionally to FIG. 2, the planar first outside terminal 211 can be configured to interface with the support 3 by means of a first contact area 31, and the planar second outside terminal 212 can be configured to interface with the support 3 by means of a second contact area 32.

For example, the planar first outside terminal 211 comprises the first contact area 31. In an embodiment, the first contact area 31 may be formed by said substantially plane bottom surface of the first outside terminal 211. Correspondingly, the planar second outside terminal 212 may comprise the second contact area 32. In an embodiment, the second contact area 32 may be formed by said substantially plane bottom surface of the second outside terminal 212.

Further within the present specification, the term "outside" may express that the first outside terminal 211 and the second outside terminal 212 may be configured to be electrically contacted by means of components external of the package 2.

For example, on the support 3, the first contact area 31 of the planar first outside terminal 211, may be electrically connected with one or more first conductive traces 351, e.g., copper lines, and the second contact area 32 of the planar second outside terminal 212 may be electrically connected with one or more second conductive traces 352, e.g., copper lines.

Accordingly, the load current conducted by the power semiconductor die 1 between the first load terminal 11 and the second load terminal 12 can "leave" or, respectively "enter" the package 2 by means of the planar first outside terminal 211 having the first contact area 31 and "enter" or, respectively "leave" the package 2 by means of the planar second outside terminal 212 having the second contact area 32. In other words, the load current entering and leaving the package may thus at least temporarily "see" an electrical connection having a cross-section which size amounts to the size of the respective contact area 31, 32.

In an embodiment, the second contact area 32 has a size that is in a range between 80% and 120% of the size of the first contact area 31. Additionally or alternatively, the first outside terminal 211 may be configured with a first current rating, and the second outside terminal 212 may be configured with a second current rating, the second current rating being in a range between 80% and 120% of the first current rating.

For example, the size of the first contact area is greater than 1 mm$^2$, greater than 3 mm$^2$, or even greater than 5 mm$^2$. For example, the package 2 has a footprint area, and each of the first contact area 31 and the second area 32 have a size within 10% to 30% of the size of the footprint area. Accordingly, in an embodiment, none of the contact areas 31 and 32 dominates with a size being greater than 30% of the package footprint area; rather, the sizes of the contact areas 31 and 32 may be substantially equal to each other and each smaller than 30% of the size of the package footprint area.

Additionally or alternatively to dimensioning the contact areas 31 and 32 as taught above, the first current rating may amount to at least 20 A/mm$^2$, to at least 25 A/mm$^2$, or to even more than 30 A/mm$^2$.

The embodiments described herewith may provide for the advantage that in terms of surface-mount technology, none of the outside terminals of the lead frame forms a bottleneck regarding operation of the enclosed die 1. For example, the aforementioned embodiments may ensure that the power losses (heat dissipation) produced by the outside terminals 211 and 212 are always smaller than the power losses produced by the enclosed die 1. A deviation between the sizes of the contact areas 31 and 32 may be even smaller than the above indicated ranges or even amount substantially to zero, and the same applies to the current ratings. For example, the contact areas 31 and 32 may exhibit sizes substantially identical to each other, and/or the current ratings of the outside terminals 211 and 212 may be substantially identical to each other.

For example, with regards to balancing the heat dissipation, it may be practicable that the first contact area 31 and the second contact area 32 are arranged symmetrically to each other, e.g., with respect to at least one axis of symmetry, e.g., in parallel to one of the lateral directions X and Y.

Further optional and exemplary aspects will now be described:

In an embodiment, each of the electrical connection between the first load terminal 11 and the first outside terminal 211 and the electrical connection between the second load terminal 12 and the second outside terminal 212 is free of any bond wires and free of any ribbons (e.g. bond connections having a stripe form). Rather, said electrical connections may be realized as described and shown herein, for example, with reference to and/or in the drawings. For example, said electrical connections may be realized by means of components formed by plating processing steps, for example. Further, in some embodiments, the package 2 does neither include any bond wires and nor any ribbons at all.

For example, each of the first contact area 31 and the second contact area 32 may be formed by a respective contiguous area, as exemplarily illustrated in FIG. 1. In another embodiment (not illustrated), the first contact area 31 may be formed by a plurality of separate first sub-areas, and the second contact area 32 may be formed by a plurality separate second sub-areas.

Figure 3:
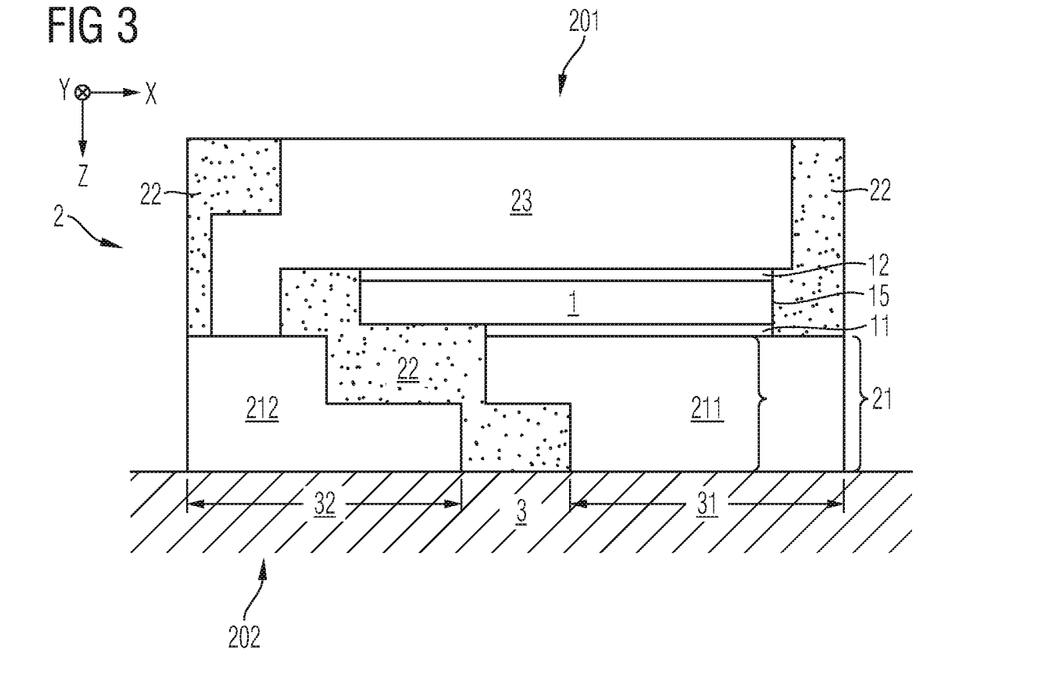
FIG. 3 schematically and exemplarily illustrates a section of a vertical cross-section of a package in accordance with one or more embodiments.
Figure 4:
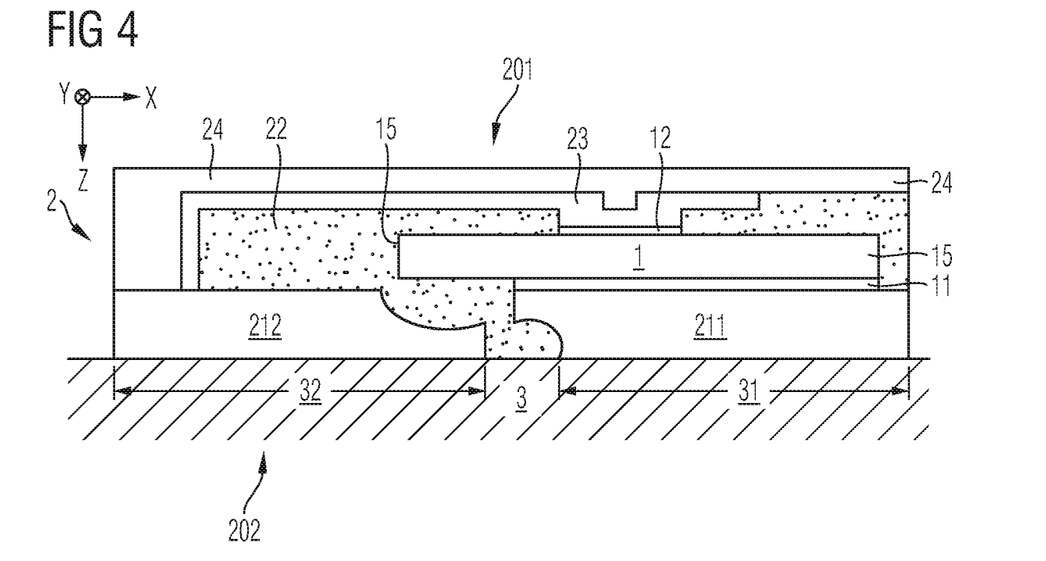
FIG. 4 schematically and exemplarily illustrates a section of a vertical cross-section of a package in accordance with one or more embodiments.
Figure 5:
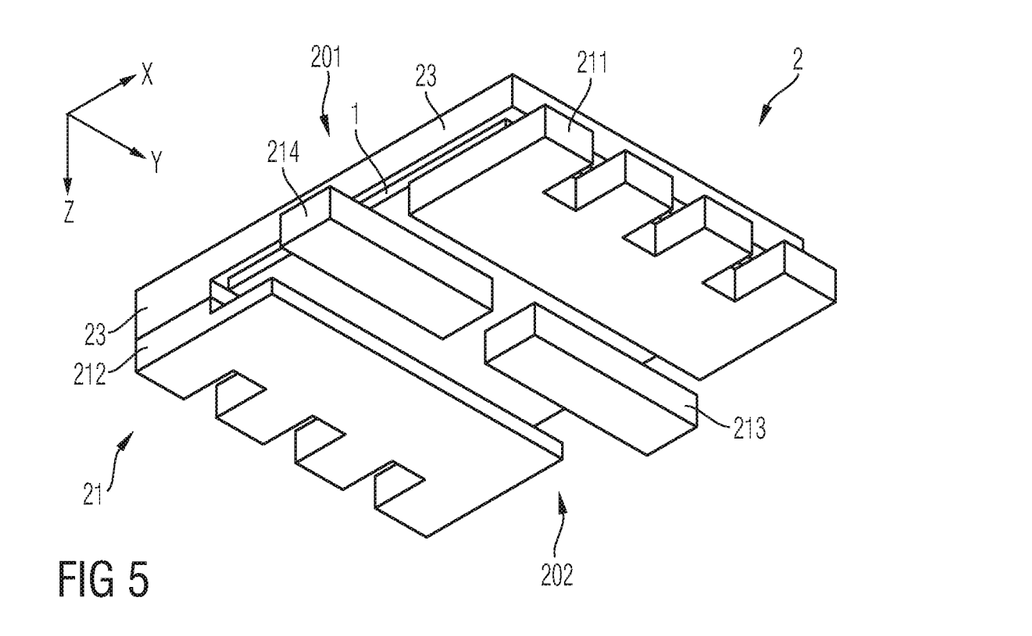
FIG. 5 schematically and exemplarily illustrates a section of a perspective view of a package in accordance with one or more embodiments.

As also exemplarily illustrated in each of FIG. 3, FIG. 4 and FIG. 5, each of the first contact area 31 and the second contact area 32 may laterally overlap with the enclosed die 1 at least partially. For example, at least 50% of the first contact area 31 laterally overlap with the enclosed die 1, and at least 10% of the second contact area 32 laterally overlap with the enclosed die 1. In an embodiment, the first contact area 31 may almost entirely laterally overlap with the enclosed die 1, and the second contact area 32 may only slightly overlap with the enclosed die 1.

For example, in order to maintain an electrical insulation between the outside terminals 211 and 212 and between the second outside terminal 212 and sections of the die 1 different from the second load terminal 12, at least one of or each of the first outside terminal 211 and the second outside terminal 212 may exhibit a profiled edge contour, e.g., a step-like configured edge, as illustrated in FIG. 1 and in FIG. 3 or an edge with well-like recesses, as illustrated in FIG. 4. For example, said profiled edge contour may be provided at terminations of the outside terminals 211, 212 that are facing to each other, as illustrated in FIG. 3 and FIG. 4.

In an embodiment, the second contact area 32 does not laterally overlap with the enclosed die 1, but for example interfaces with the support 3 in a section that is entirely laterally spaced apart from the die 1.

Figure 6:
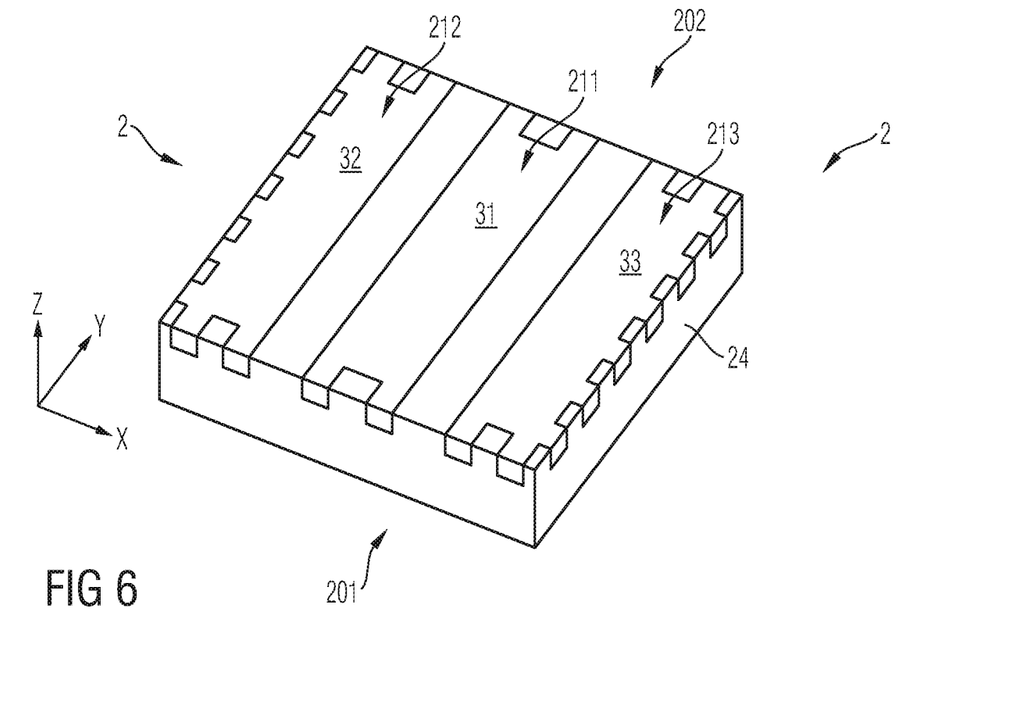
FIG. 6 schematically and exemplarily illustrates a section of a perspective view of a package in accordance with one or more embodiments.

Now regarding in more detail the embodiments illustrated in FIGS. 5 and 6, as has been explained above, the die 1 may comprise at least one further terminal (not illustrated), e.g., arranged on the die frontside 101, where also the first load terminal 11 is arranged. For example, the at least one further terminal may comprise at least one of a sensor terminal and a control terminal, e.g., a gate terminal in case the die 1 is implemented controllable device, such as an MGD or a transistor, e.g., MOSFET or an IGBT. For example, the further terminal (e.g. the control terminal and/or the sensor terminal) may be electrically insulated from each of the first load terminal 11 and the second load terminal 12.

If the die 1 has such further terminal, the lead frame 21 may have a planar third outside terminal 213 electrically connected with one of the at least one further terminal and electrically insulated from each of the first outside terminal 211 and the second outside terminal 212. The planar third outside terminal 213 can be configured to interface with the support 3 by means of a third contact area 33. Regarding the terms "planar" and "outside" with respect to the third terminal 213, it is referred to the exemplarily explanations given above with respect to the first and second terminal 211, 212, which may analogously apply to the planar third outside terminal 213.

For example, the third contact area 33 may have a size in a range between 80% and 120% of the size of the first contact area 31. In an embodiment, as illustrated in FIG. 6, each of the first contact area 31, the second area 32 and the third contact area 33 may have substantially identical sizes.

If the die 1 as a second one of such further terminal, e.g., each of a control terminal and a sensor terminal, the lead frame 21 may further have a fourth outside terminal 214 electrically connected with the second further terminal and electrically insulated from each of the first outside terminal 211, the second outside terminal 212 and the third outside terminal 213. The planar fourth outside terminal 214 can be configured to interface with the support 3 by means of a fourth contact area 34, as illustrated in FIG. 5. Regarding the terms "planar" and "outside" with respect to the fourth terminal 214, it is referred to the exemplarily explanations given above with respect to the first and second terminal 211, 212, which may analogously apply to the planar fourth outside terminal 214.

In an embodiment, in accordance with the schematic illustration in FIG. 6 but in contrast to the schematic illustration in FIG. 5, each of the first contact area 31, the second area 32, the third contact area 33 and (if present) the fourth contact area 34 may have substantially identical sizes. However, as the further terminals of the die, e.g., a control terminal and a sensor terminal, are possibly not used for load current carrying purposes, but for other, less current employing purposes, e.g., sensing and controlling, each of the third and fourth contact areas 33 and 34 may be dimensioned smaller as compared to the first and second contact areas 31 and 32, as illustrated in FIG. 5.

Also, the planar third and fourth outside terminals 213 and 214 may be configured to allow mounting the package 2 in accordance with the surface-mount technology. Further, also each of the planar third and fourth outside terminal 213 and 214 may be so-called flat contacts formed in accordance with the surface-mount technology.

As further illustrated in each of FIGS. 5 and 6, the planar first and second outside terminals 211 and 212 may each comprise a tooth-like termination structure that interfaces with the housing 24 of the package 2.

Figure 7:
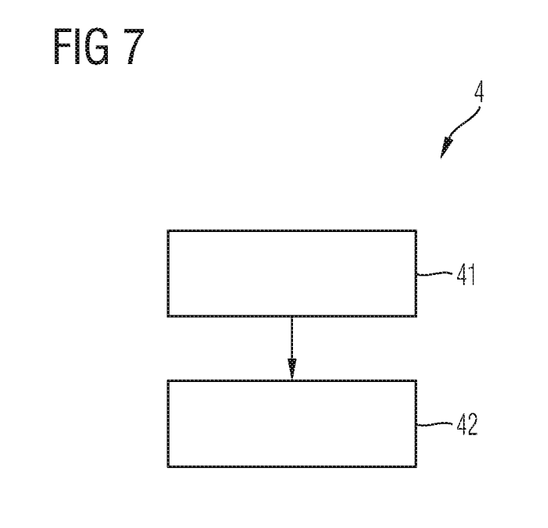
FIG. 7 schematically and exemplarily illustrates steps of a method of producing a package for enclosing a power semiconductor die in accordance with one or more embodiments.

FIG. 7 schematically and exemplarily illustrates steps of a method 4 of producing a package 2 for enclosing a power semiconductor die 1 in accordance with one or more embodiments.

For example, method 4 may include providing, in step 41, a lead frame 21 configured to electrically and mechanically couple the package 2 to a support 3, the lead frame 21 having said planar first outside terminal 211 electrically connected with the first load terminal 11 of the die and said planar second outside terminal 212 electrically connected with the second load terminal 12, wherein the planar first outside terminal 211 is configured to interface with the support 3 by means of a first contact area 31, and the planar second outside terminal 212 is configured to interface with the support 3 by means of a second contact area 32.

Method 4 may further include step 42, in which at least one of actions a) and b) occur: a) configuring the second contact area 32 to have a size being in a range between 80% and 120% of a size of the first contact area 31 and b) configuring the first outside terminal 211 to have a first current rating and the second outside terminal 212 with a second current rating, the second current rating being in a range between 80% and 120% of the first current rating.

For example, method 4 may include one or more processing steps commonly involved within the surface-mount package manufacturing technology. For example, this may include at least one of
- designing the lead frame 21 and the clip 23 that may be used to electrically connect the second load terminal 12 with the second planar outside terminal 212;
- one or more die bonding processing steps, e.g., for mechanically and electrically installing the die 1 within in the package 2;
- one or more clip bonding processing steps, e.g., for establishing said electrical connection between the second load terminal 12 and the second planar outside terminal 212;
- one or more molding processing steps, e.g., to provide for an electrical insulation between the outside terminals 211 and 212;
- one or more deflashing processing steps, e.g., so as to clean the outside terminals 211 and 212, e.g., by removing eventual mold-compound-flashes;
- and/or plating processing steps, e.g., so as to adjust final dimensions of the outside terminals 211 and 212; and/or
- one or more laser marking processing steps, e.g., for the purpose of a subsequent package singulation.

For example, method 4 described above may be employed to produce one or more embodiments of the package 2 described above. Thus, it shall be understood that exemplary aspects of the package 2 described above may analogously apply to the method 4 described herein and vice versa.

In accordance with one or more embodiments, a surface-mount package enclosing a die, e.g., in a Source-Down arrangement, is presented that provides for high-current capability and that allows for profiting of the entire or at least a dominating part of operating range of the die without having one of the planar outside terminals of the package (e.g., flat contacts) forming a bottleneck, e.g., by means of critical power losses due to a too small dimensioning of one of the load current carrying flat contacts. In addition, due to the contact areas of the planar outside terminals being equally or at least similarly dimensioned, power losses may be even distributed within the package footprint area, which may allow for achieving reliable thereto-mechanical properties of the package.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A package enclosing a power semiconductor die, the package having a package top side and a package footprint side, the die having a first load terminal at a die frontside facing the package footprint side and a second load terminal arranged at a die backside facing the package top side, wherein the package comprises:
    a lead frame configured to electrically and mechanically couple the package to a support, the lead frame having a planar first outside terminal electrically connected with the first load terminal and a planar second outside terminal electrically connected with the second load terminal,
    wherein at least one of:
        the planar first outside terminal is configured to interface with the support by means of a first contact area and the planar second outside terminal is configured to interface with the support by means of a second contact area having a size that is within a range between 80% and 120% of a size of the first contact area; and
        the first outside terminal has a first current rating and the second outside terminal has a second current rating that is within a range between 80% and 120% of the first current rating, and
    wherein the power semiconductor die is configured to conduct a load current between the first load terminal and the second load terminal in a range between 1 A and 300 A, and block a voltage between the first load terminal and the second load terminal in a range between 10 V and 500 V.

2. The package of claim 1, wherein the package is a surface-mount package.

3. The package of claim 1, wherein the die has a power semiconductor transistor configuration, wherein the first load terminal is a source terminal, and wherein the second load terminal is a drain terminal.

4. The package of claim 1, wherein each of the first contact area and the second contact area is formed by a respective contiguous area.

5. The package of claim 1, wherein the electrical connection between the second outside terminal and the second load terminal comprises a clip that is disposed over the die backside and extends over and spaced from an edge of the die to the second outside terminal.

6. The package of claim 1, wherein each of the first contact area and the second contact area laterally overlap with the die at least partially.

7. The package of claim 6, wherein at least 50% of the first contact area laterally overlaps with the die and/or at least 10% of the second contact area laterally overlaps with the die.

8. The package of claim 1, wherein the first outside terminal is configured with the first current rating and the second outside terminal is configured with the second current rating, the second current rating is in the range between 80% and 120% of the first current rating.

9. The package of claim 1, wherein the first current rating is at least 20 A/mm2.

10. The package of claim 1, wherein the size of the second contact area is in a range between 80% and 120% of the size of the first contact area.

11. The package of claim 1, wherein the electrical connection between the first load terminal and the first outside terminal and the electrical connection between the second load terminal and the second outside terminal are free of any bond wires and free of any ribbons.

12. The package of claim 1, wherein the first contact area and the second contact area are arranged symmetrically to each other.

13. The package of claim 1, wherein the die has a further terminal at the die frontside, wherein the lead frame has a planar third outside terminal electrically connected with the further terminal and electrically insulated from each of the first outside terminal and the second outside terminal, and wherein the planar third outside terminal is configured to interface with the support by means of a third contact area.

14. The package of claim 13, wherein the third contact area has a size that is within a range between 80% and 120% of the size of the first contact area.

15. The package of claim 1, wherein the lead frame is configured to couple the package to the support such that the package footprint side faces a surface of the support.

16. The package of claim 1, wherein the package has a footprint area, and wherein each of the first contact area and the second area has a size within 10% to 30% of a size of the footprint area.

17. A package, comprising:
a lead frame comprising a first outside terminal and a second outside terminal; and
a power semiconductor die at partly enclosed in an insulating material and comprising a first load terminal facing and electrically connected to the first outside terminal and a second load terminal at an opposite side of the die as the first load terminal and electrically connected to the second outside terminal,
wherein the first outside terminal has a planar first contact area facing away from the die and configured for surface mounting to a support,
wherein the second outside terminal has a planar second contact area facing away from the die and configured for surface mounting to the support,
wherein the package has a footprint area which includes the planar first contact area and the planar second contact area,
wherein the planar first contact area and the planar second contact area are each smaller than 30% of the footprint area.

18. The package of claim 17, wherein the planar first contact area and the planar second contact area are of substantially equal size.

19. A method of producing a package for enclosing a power semiconductor die, the package having a package top side and a package footprint side, the die having a first load terminal at a die frontside facing the package footprint side and a second load terminal arranged at a die backside facing the package top side, the method comprising:
providing a lead frame configured to electrically and mechanically couple the package to a support, the lead frame having a planar first outside terminal electrically connected with the first load terminal and a planar second outside terminal electrically connected with the second load terminal, wherein the planar first outside terminal is configured to interface with the support by means of a first contact area, and the planar second outside terminal is configured to interface with the support by means of a second contact area; and
configuring the second contact area to have a size that is in a range between 80% and 120% of a size of the first contact area and/or configuring the first outside terminal to have a first current rating and the second outside terminal to have a second current rating that is in a range between 80% and 120% of the first current rating,
wherein the power semiconductor die is configured to conduct a load current between the first load terminal and the second load terminal in a range between 1 A and 300 A, and block a voltage between the first load terminal and the second load terminal in a range between 10 V and 500 V.

* * * * *

UNITED STATES PATENT AND TRADEMARK OFFICE
CERTIFICATE OF CORRECTION

PATENT NO. : 10,699,987 B2  
APPLICATION NO. : 15/954233  
DATED : June 30, 2020  
INVENTOR(S) : Otremba et al.

Page 1 of 1

It is certified that error appears in the above-identified patent and that said Letters Patent is hereby corrected as shown below:

On the Title Page

Assignee, please change "tInfineon Technologies Austria AG" to -- Infineon Technologies Austria AG --

Signed and Sealed this  
Twenty-third Day of February, 2021

Drew Hirshfeld  
*Performing the Functions and Duties of the*  
*Under Secretary of Commerce for Intellectual Property and*  
*Director of the United States Patent and Trademark Office*